(12) United States Patent
Terauchi

(10) Patent No.: US 6,579,776 B2
(45) Date of Patent: Jun. 17, 2003

(54) METHOD OF MANUFACTURING SEMICONDUCTOR DEVICE

(75) Inventor: Takashi Terauchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/083,116

(22) Filed: Feb. 27, 2002

(65) Prior Publication Data

US 2002/0079596 A1 Jun. 27, 2002

Related U.S. Application Data

(62) Division of application No. 09/553,486, filed on Apr. 20, 2000, now Pat. No. 6,407,464.

(30) Foreign Application Priority Data

Oct. 19, 1999 (JP) ............................................ 11-296547

(51) Int. Cl.⁷ ................................................ H01L 21/00
(52) U.S. Cl. ........................ 438/396; 438/253; 438/397
(58) Field of Search ................................ 438/250–256, 438/396, 397, 637–640, 672–675, 700

(56) References Cited

U.S. PATENT DOCUMENTS

| | | | |
|---|---|---|---|
| 5,488,011 A | 1/1996 | Figura et al. | |
| 5,650,349 A | 7/1997 | Prall et al. | |
| 5,705,438 A | 1/1998 | Tseng | |
| 5,866,453 A | 2/1999 | Prall et al. | |
| 6,008,085 A | 12/1999 | Sung et al. | |
| 6,020,643 A | 2/2000 | Fukuzumi et al. | |
| 6,200,875 B1 * | 3/2001 | Jang et al. | 438/396 |

FOREIGN PATENT DOCUMENTS

JP    4-167464    6/1992

* cited by examiner

*Primary Examiner*—David Nelms
*Assistant Examiner*—Dung Anh Le
(74) *Attorney, Agent, or Firm*—McDermott, Will & Emery

(57) ABSTRACT

A method of manufacturing semiconductor device having a structure in which the potential of a gate interconnection is not affected by that of a bit line when a dummy pad contact is formed at an end portion of a memory cell, in which no steps are formed in the vicinity of a memory cell end are obtained. The semiconductor device includes dummy pad contacts arranged in a dotted line, which are smaller than a first pad contact in the memory cell body and are opened using a self-alignment method, and a conduction is cut-off in a path leading from the dummy pad contact to the bit line.

3 Claims, 19 Drawing Sheets

METHOD OF MANUFACTURING SEMICONDUCTOR DEVICE

This application is a divisional of U.S. patent application Ser. No. 09/553,486, filed Apr. 20, 2000 now U.S. Pat. No. 6,407,464.

BACKGROUND OF THE INVENTION

1. Field of the Invention

The present invention relates to a semiconductor device and a method of manufacturing a semiconductor device. More particularly, the invention relates to a semiconductor device in which a short-circuit between gate interconnections and bit lines caused by a dummy pad contact formed at an end of memory cells using a self-alignment method is avoided, and to a method of manufacturing a semiconductor device in which a step produced between memory cells and their peripheral portions can be eliminated by forming and polishing a dummy pad contact at the end of memory cells.

2. Description of the Background Art

In recent years, the degree of integration of semiconductor devices has been enhanced and memory cells have been reduced in size, so that it has been difficult to form contacts in the gap between interconnections only by photo-resist masking without short-circuiting the interconnections. One of the methods used for forming contacts in gaps of interconnections without short-circuiting is a so-called self-alignment method. FIG. 28 shows a sectional view of a pad contact hole opened in an interlayer oxide film using this self-alignment method. In FIG. 28, a silicon interconnection 902 which comes to be a gate interconnection is formed on a semiconductor substrate 910 with an insulating film 901 interposed, and is coated with nitride layers 903, 904. On an interlayer oxide film 905 deposited on these layers, a pad contact hole 915, where a pad contact is formed for conducting an active region 911 and a top layer portion, is opened.

The self-alignment method in general is now described in order. First, a silicon interconnection is deposited on a semiconductor substrate with an insulating film interposed. A nitride film protecting the silicon interconnection is then formed on the top and the side surfaces of the silicon interconnection. In this step, the silicon interconnection comes to be coated with the nitride film. Thereafter, an interlayer oxide film is deposited and then the interlayer oxide film is etched to open a contact hole using a photo-resist mask on a desired position. When the interlayer oxide film is etched with selective ratio of the oxide film (i.e., the interlayer oxide film) to the nitride film being greater than prescribed value, the silicon interconnection can be protected from etching, by the nitride film on the top and the side surfaces. Thus, if the opening diameter of pad contact hole 915 is larger than the interval between silicon interconnections, as shown in FIG. 28, the opening diameter would be overlapped with the silicon interconnections. No short-circuit occurs, however, as the silicon interconnection is protected by the nitride layer. Therefore, as shown in the sectional view of FIG. 29, the nitride films 903, 904 on the top and the side surfaces of the silicon interconnections are left with a sufficient thickness, even when the pad contact hole 915 is opened. With this method, the pad contact can be formed without short-circuiting the silicon interconnection and the pad contact.

On the other hand, from the reason described in the following, at end portions of memory cells, a dummy pattern such as a dummy pad contact is generally provided. Since the continuity (repetition) of the pattern is lost at the end of the memory cells, the pattern at the end-most portion, especially the contact diameter, is reduced due to an optical proximity effect. To dissolve this inconvenience, a dummy contact is provided around a body of the memory cells. By providing the dummy contact, though the dummy contact diameter becomes small due to an optical proximity effect, the memory cell body contact formed inner than the dummy contact can have an intended size. In this case, it is very difficult to control the size of the pattern in the end-most portion. For example, even when the size of the mask is set a little larger than that of the pad contact in the memory cell, the diameter of pad contact 921 at the end may possibly be oversized, resulting in short-circuiting with adjacent pad contact 920 positioned inside. In FIG. 30, there is also shown an arrangement of a gate interconnection 930 and another pad contact (the second pad contact) 906 on which a bit line contact is formed. In the following description, pad contact 906 formed overlapped with the bit line when viewed two-dimensionally will be referred to the second pad contact, and is distinguished from pad contact 921 (the first pad contact) formed between the bit lines. Furthermore, in particular, when referred simply as "contact" or "pad contact", it will include both pad contacts.

Thus, as it is difficult to control the size of the pad contact at the endmost portion, as shown in FIG. 31, a mask opening 924 of the first pad contact in the dummy and a mask opening 925 of the first pad contact of the memory cell body are normally formed to have the same size. In FIG. 31, there is also shown a mask opening 926 for the second pad contact 906. As a result of setting mask opening 924 of the first pad contact in the dummy, the diameter of first pad contact 921 of the dummy becomes smaller than that of first pad contact 920 of the cell body, as shown in FIG. 32.

The above-described self-alignment method has the following problems. When a contact hole is opened using the self-alignment method and the hole diameter of the photo-resist to be an etching mask is small, the tip portion of the etching gas opening the interlayer oxide film will not contact in wide area with the nitride film on the top and side of the interconnection. When the etching gas contacts in wide area with the nitride film coating the interconnection, the etching selective ratio of the oxide film (i.e., the interlayer oxide film) to the nitride film is high in etching so that the etching gas will not much etch the nitride film. The reason for this is as follows: $C_4F_8$, $C_5F_8$, $CH_2F_2$ and so forth are used as etching gas species, and these plasma gas etch the interlayer oxide film and the nitride film while depositing a film of polymer including C on the nitride film. Thus, when the contact area between the nitride film of the gate interconnection coating and the etching gas is wide, the nitride film is etched while the sufficient deposition film being deposited. When only a corner of the gate interconnection coating and the etching gas contacts, however, the deposition does not much proceed while the etching only proceeds. Therefore, when the diameter of the contact hole is small, the etching selective ratio of the oxide film to the nitride film in the etching will be low. At the end portion of the memory body, the diameter of the contact hole becomes smaller due to an optical proximity effect, so that the etching selective ratio of the oxide film to the nitride film on the etching will be low. Thus, if the dummy pad contact is formed at the end of the memory cells using the self-alignment system, the remaining nitride film will be thinner as shown in the circle A in FIG. 33. Therefore, at the step in which the nitride film at the contact bottom is eliminated, the interconnections are exposed at the top and the side wall of the interconnections, as shown in the circle B in FIG. 34. As a result, filling a plug to form a pad contact causes short-circuit with the pad contact.

Today, as the sizes of semiconductor devices and contacts thereof are more and more being reduced, the frequency of such short-circuits tends to be increasing. In the case of a contact in a memory cell body, a mask opening may be so provided as to enable the etching gas to somehow contact in a wide area with the nitride film on top and side wall portions of the interconnections. With respect to a dummy pad contact which is smaller in size due to an optical proximity effect, however, the contact area with the nitride film is smaller so that the nitride film is, in fact, easily eliminated by etching. Thus, when a pad contact is formed between gate interconnections using the self-alignment method, the first dummy pad contact being smaller in size has higher possibility of short-circuiting with the gate interconnections. FIG. 35 is a plan view of an end portion of a memory cell showing the first dummy pad contacts 921 formed at the end portion of the memory cell. The diameter of first dummy pad contact 921 formed at the end portion of the memory cell is smaller than that of the first pad contact 920 of the inner memory cell body. In FIG. 35, bit line 908 is conducted with an active region via a bit line contact 909 and the second pad contact 906. FIG. 36 is a sectional view taken along line XXXVI—XXXVI of FIG. 35. As shown in FIG. 36, if first dummy pad contact 921 was short-circuited with gate interconnection 902 at section B, the short-circuited gate interconnection 902 would be conducted with bit line 908 via active region 911. As a result, the electric potential of bit line affects that of the gate interconnection, causing malfunction of the device. Thus, the structure and the size of the first dummy pad contact have come to present such problems that were previously not experienced, because the self-alignment method is used for opening and forming contacts.

Further, aside from the above, the following problem arises in connection with a boundary portion of a memory cell area and a peripheral area thereof. FIG. 37 shows an arrangement of various portions of an end portion of a memory cell. FIG. 38 is a sectional view taken along line XXXVIII—XXXVIII of FIG. 37, showing a structure in which an inter-layer insulating film is formed. It is understood that an inter-layer insulating film 905, formed across both regions of the memory cell and its peripheral portion, reflects the under-layer structure, so that the inter-layer insulating film of the memory cell is positioned higher than that of the peripheral area thereof, resulting in a step at the boundary portion 950. The step C could not be eliminated by polishing through CMP(Chemical Mechanical Polishing) method, as shown in FIG. 39. This causes variation in sizes of bit line contact and a photo-resist of the bit line of upper layers.

SUMMARY OF THE INVENTION

An object of the invention is to provide a semiconductor device with a structure in which no short-circuit occurs between dummy pad contacts and gate interconnections when dummy pad contacts are formed at an end portion of a memory cell, or semiconductor device with a structure in which bit lines would not affect the electric potential of gate interconnections even if a short-circuit occurred between the dummy pad contacts and the gate interconnections. Furthermore, another object of the invention is to provide a method of manufacturing a semiconductor device, in which no large steps are produced on an inter-layer insulating film in the vicinity of an end-portion of a memory cell.

According to one aspect of the invention, a semiconductor device includes a semiconductor substrate, an active region formed by introducing an impurity onto a main surface of the semiconductor substrate, a gate interconnection deposited on the main surface of the semiconductor substrate with an insulating layer interposed, a gate interconnection coating formed of a nitride film protecting the gate interconnection, a bit line formed above the gate interconnection crossing the gate interconnection when viewed two-dimensionally, and an inter-layer oxide film covering the main surface of the semiconductor substrate and the gate interconnection coated by a gate interconnection coating. The semiconductor device further includes a memory cell having a first pad contact formed, penetrating through the oxide film, between the gate interconnection and the bit line, when viewed two-dimensionally, and conducting the active region and the upper-layer portion, and a second pad contact formed, penetrating through the oxide film, overlapped with the bit line, when viewed two-dimensionally, between gate interconnections, conducting the active region and the bit line via a bit line contact. The semiconductor device further includes first dummy pad contacts formed between gate interconnections, using a self-alignment method, along with an end portion of a memory cell in a dotted line, and means for interrupting an electric conduction occurred between the first dummy pad contact and the bit line somewhere in a path leading from the first dummy pad contact through the active region, the second pad contact and the bit line contact all the way to the bit lines.

This arrangement prevents the serial conduction of the path leading from the first dummy pad contacts to the bit lines. Thus, no short-circuiting would occur, even when the first dummy pad contacts formed at an end portion of a memory cell comes to have smaller size because of an optical proximity effect, and as a result, an etching selective ratio of the oxide film (i.e., inter-layer insulating film) to a nitride film becomes smaller in etching and the nitride film is eliminated or formed extremely thin. Thus, the potential of the bit line would not affect that of the gate interconnection, even if any one of the first dummy pad contacts arranged in a dotted line is short-circuited with the gate interconnection. The bit line of the above-described semiconductor substrate may be a bit line provided in a memory cell body. Alternatively, it may be dummy bit lines provided in order to form bit lines in the body side of an intended size. Furthermore, bit lines can be both of the above. As a constant potential is applied to the dummy bit line, when a short-circuit occurs, the influence of the dummy bit line on the potential of the gate interconnection is larger than that of the bit line of a memory cell body.

According to one aspect of the invention, the above-described conduction is blocked when, for example, the first dummy pad contacts arranged in a dotted line are all formed on a region other than the active region of a main surface on a semiconductor substrate so as to cut-off the electric conduction between the first dummy pad contacts and the active region. In this case, it is desirable that the region other than the active region is the region of an isolating insulating film.

Because the above-described arrangement cuts-off the electric conduction between the first dummy pad contact and the active region, the potential of the bit line will not affect the electric potential of the gate interconnection.

Furthermore, in order to form the first dummy pad contacts at the end-most portion of a memory cell on the isolating insulating film in a dotted line, it is desirable to form the first dummy pad contacts in two dotted lines at an end portion of a memory cell, with the first dummy pad contacts at the end-most line of the memory cell being arranged on a region of the isolating insulating film in a dotted line.

Such arrangement ensures opening of the first dummy contact holes of the outer-most line on the isolating insulating film. As a result, no problems will be caused, even if the size and the selective ratio of an oxide film to a nitride film are reduced when opening the first dummy pad contact holes in the out-most line, and the first dummy pad contacts and the gate interconnections are short-circuited due to the loss or the thinness of the nitride film. Therefore, the conduction between the first dummy pad contacts and the active region of the main surface on the semiconductor substrate will not occur, and the potential of the gate interconnection would not affect that of the bit line.

In another example in which the above-described conduction does not occur, a bit line may be formed detouring a bit line contact to avoid an electric conduction between the bit line contact and the bit line. This arrangement also prevents the influence on the potential of the gate interconnection, caused by that of the bit line.

Another example in which the above-described conduction does not occur is that the first dummy pad contacts are formed within the inter-layer oxide film and not reaching the gate interconnection coating, cutting off the electric conduction between the first dummy pad contact and the active region. The bit line contact may be formed within the insulating film, not penetrating the insulating film formed on the above-said inter-layer oxide film, cutting off the electric conduction between the bit line contact and the second pad contact.

A semiconductor device according to another aspect of the invention includes a semiconductor substrate, an active region formed on a main surface of the semiconductor substrate with an impurity introduced, a gate interconnection deposited on a main surface of the semiconductor substrate with an insulating film interposed, a gate interconnection coating formed of a nitride film, which encloses and protects the gate interconnection, a bit line formed above the gate interconnection crossing the gate interconnection when viewed two-dimensionally, and an inter-layer oxide film covering the main surface of the semiconductor substrate and the gate interconnection coated with the gate interconnection coating. The semiconductor device also includes a memory cell having a first pad contact formed, penetrating through the oxide film, between the gate interconnection and the bit line, when viewed two-dimensionally, conducting the active region and the upper-layer conducting interconnection, and a second pad contact formed, penetrating the inter-layer oxide film, overlapped with the bit line, when viewed two-dimensionally, between gate interconnections, conducting the active region and the bit line via a bit line contact. The semiconductor further includes first dummy pad contacts formed between gate interconnections, using a self-alignment method, along with an end portion of a memory cell in a dotted line, the interconnection coated with a gate interconnection coating having an extended width, when viewed two-dimensionally, at the end portion of the memory cell where the first dummy pad contacts are provided.

When a contact hole for the first dummy pad contact is formed, the size of the contact area between etching gas and a nitride film, which is a protective layer for the gate interconnection, is enlarged because of the above-described arrangement. This prevents reduction of the etching selective ratio of the oxide film (i.e., an inter-layer insulating film.) to the nitride film in etching. For this reason, etching of the nitride film (i.e., a gate interconnection coating) by larger amount can be avoided. As a result, the conduction between the first dummy pad contact and the gate interconnection will not occur, and the potential of the gate interconnection will not affect that of the bit line.

In a semiconductor device according to a further aspect of the invention, the effect of widening the gate interconnection at an end portion of the memory cell can be seen from the following examples. The first dummy pad contacts arranged in a dotted line all have more than a half of the lower end portions, not reaching the main surface of the semiconductor substrate, when viewed two-dimensionally. More than a half of the lower end portions contact with and stop at the top and side surfaces of the gate interconnection, and none of the first dummy pad contacts arranged in a dotted line conducts with the gate interconnections. This prevents the electric potential of the gate interconnections from influencing that of the bit lines, since no short-circuit occurs between the first dummy pad contact and the gate interconnection.

In the semiconductor device according to another aspect of the invention, all of the lower end portions of the first dummy pad contacts may contact with and stop at the gate interconnection coating layer which coats the gate interconnection.

The above-described arrangement prevents the reduction of the etching selective ratio of the oxide film to the nitride film in etching the oxide film, when the first dummy contact holes are formed. Thus the nitride film remains thick, and short-circuit between the first dummy contact holes and the gate interconnections can be avoided. For another reason from above, even if the short-circuit occurred between the first dummy pad contacts and the gate interconnections, the electric potential of the gate interconnections would not be influenced by that of the bit lines, as the first dummy pad contact does not reach the active region.

Further, in the semiconductor device according to a still further aspect of the invention, the gate interconnection coated with the gate interconnection coating preferably has its width increased at one side, when viewed two-dimensionally, to include the first dummy pad contact in the end portion of the memory cell where the dummy pad contacts are provided.

The above-described arrangement permits the tip of the first dummy pad contacts to be completely and securely held on the gate interconnection coating layer, even if the reduction in the size of the first dummy pad contacts or some misalignment in the contacts occurred. In a semiconductor device, where more than a half of the lower end portions of all the first dummy pad contacts contact with and stop at the gate interconnection coating on the top and the side of the gate interconnection and where the conduction between any of the first pad contacts and the gate interconnection is avoided, the gate interconnection coated with the gate interconnection coating is preferably made wider at both sides thereof to overlap with the first dummy pad contacts, when viewed two-dimensionally, at the end portions of the memory cell where the first dummy pad contacts are provided.

As described above, because of the gate interconnection widened at opposite sides at the end portion of the memory cell, the contact area between etching gas and the nitride film can be enlarged and the reduction of the etching selective ratio of the oxide film to the nitride film can be prevented. Thus, the progress of etching on the nitride film can be suppressed and short-circuit between the first dummy pad contacts and the gate interconnection can be prevented.

In the semiconductor device according to yet another aspect of the invention, the gate interconnection coated with the gate interconnection coating, formed at the end portion of the memory cell where the first dummy pad contact is provided, is preferably a dummy gate interconnection coated with the gate interconnection coating.

The dummy gate interconnection can be formed primarily for suppressing the progress of etching, better than the gate interconnection formed on the memory cell body, and yet eliminating possibility of short-circuit, depending on manufacturing processes.

A method of manufacturing a semiconductor device according to a yet further aspect of the invention includes the steps of forming a memory cell including an array of gate interconnections on a main surface of the semiconductor, forming an inter-layer insulating film over regions of a memory cell and the continuing peripheral region thereof, providing a dummy pad contact holes, each at a gap between a gate interconnection and a bit line, in a dotted line along an end portion of the memory cell, forming a plug at each dummy pad contact hole, and continuously polishing to planarize the inter-layer insulating film at the regions of a memory cell and the continuing peripheral region thereof.

When a dummy pad contact is not provided, the inter-layer insulating film usually becomes thicker at the memory cell body side and thinner at the peripheral portions thereof, causing a large step around that portion. If the step portion is polished after providing the dummy pad contact as described above, however, the area contacting with the polishing cloth at the end portion of the memory cell is reduced and the polishing rate at the memory cell body side is increased, allowing elimination of the step. It is preferable that the polishing is performed by the CMP (Chemical Mechanical Polishing) method because, it can easily attain the high degree of flatness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
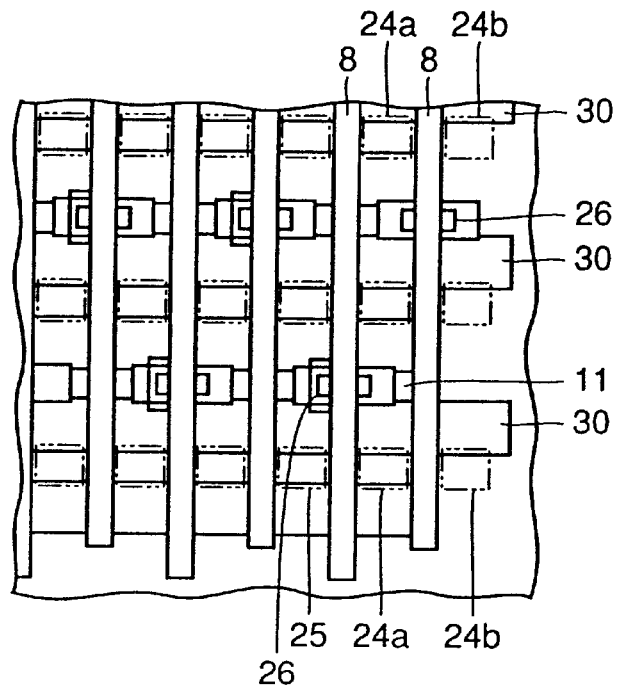
FIG. 1 is a top plan view illustrating an end portion of a memory cell in a semiconductor device according to the first embodiment, with pad contact openings shown in imaginary lines.
Figure 2:
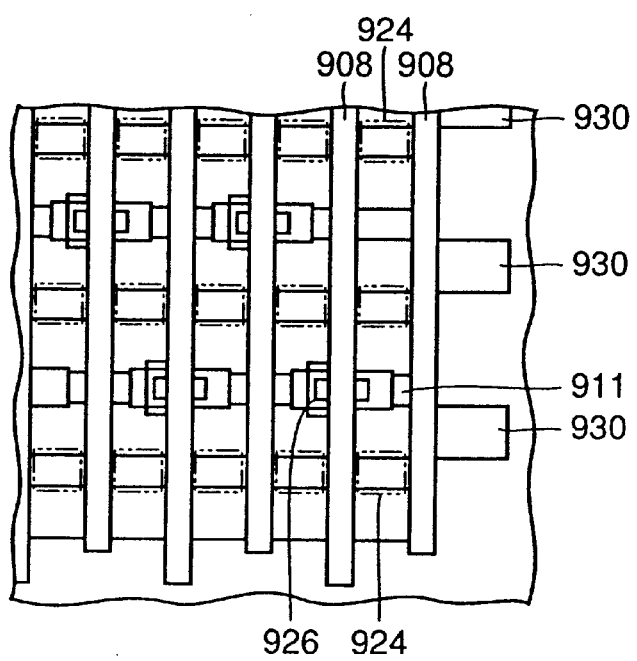
FIG. 2 is a top plan view illustrating an end portion of a memory cell in a conventional semiconductor device for comparison with FIG. 1, with pad contact openings shown in imaginary lines.

Referring to FIG. 1, a bit line is formed orthogonal to a gate interconnection 30, and mask openings 24a, 24b are provided in two lines to form the first dummy pad contacts in two lines between the gate interconnections. A bit line 8 is conducted with under-layer portions via a bit line contact. In FIG. 2, mask openings 924 for the first dummy pad contact holes are provided in a line, each arranged in a gap enclosed by a gate interconnection 930 and a bit line 908. In the first embodiment of the present invention shown in FIG. 1, compared with a prior art example shown in FIG. 2, the first dummy pad contact of an end-most portion can be formed, for example, on an isolating insulating film or the like, securely away from the active region. In FIG. 1, the first dummy pad contact is not affected by the optical proximity effect, so that the size thereof is not reduced, resulting in no reduction of the etching selective ratio of the oxide film to the nitride film upon etching.

Figure 3:
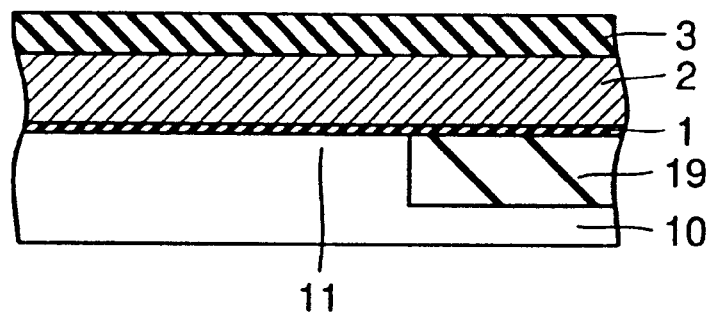
FIG. 3 is a sectional view of a structure in which a nitride film that is a coating layer is deposited on a gate interconnection layer according to the manufacturing method of a semiconductor device of the first embodiment.

A manufacturing method according to the first embodiment of the invention is now described. First, an isolating insulating region 19 is formed on a semiconductor substrate 10 using a thermal oxide film burying method and so forth. The region other than isolating insulating region 19 will be an active region 11. Thereafter, as shown in FIG. 3, a silicon oxide film 1 is formed, and then a silicon film 2 forming a gate interconnection and a nitride film 3 which is a coating film for the gate interconnection are successively deposited. In FIG. 3, silicon oxide film 1 is a thermal oxide film or an undoped silicon oxide film deposited using a reduced pressure and an atmospheric CVD methods. Silicon oxide film 1 has a thickness of 5 to 10 nm. Furthermore, a polycrystalline silicon film or an amorphous silicon film, doped with P, As or the like and deposited using CVD method, is used to form a silicon film forming a gate interconnection 2. A silicide film of a metal having a high melting point such as Ti, TiN or W, or the muti-layer film thereof, or a conducting metal film such as W, Al may also be used. Any of these films has a thickness ranging from 50 to 500 nm. Nitride layer 3 is formed of a film to which the etching selective ratio of the oxide film results in a prescribed value or higher, when an inter-layer insulating film, which is an oxide film, is dry etched by RIE (Reactive Ion Etching) method. Specifically, a silicon nitride film or a nitride oxide film, deposited by CVD method, or the muti-layer film thereof may be used. Any of these films has a thickness ranging from 20 to 100 nm.

Figure 4:
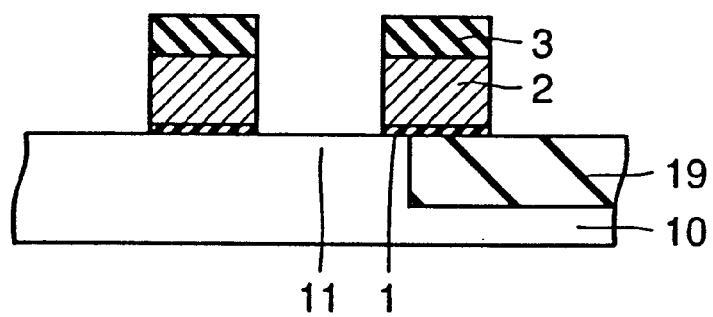
FIG. 4 is a sectional view of a structure in which the structure of FIG. 3 is masked and etched to form a gate interconnection having a desired shape.
Figure 5:
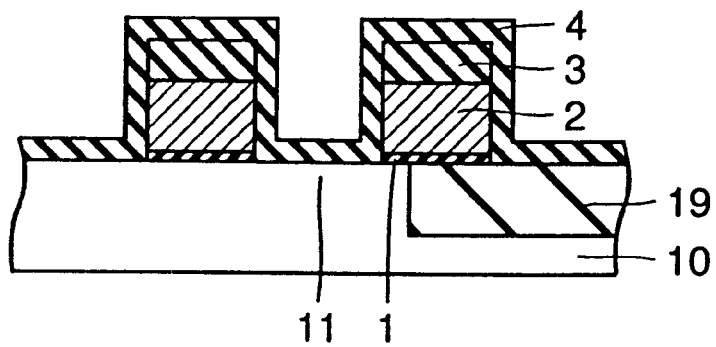
FIG. 5 is a sectional view of a structure in which a nitride film is deposited on the entire surface of the structure of FIG. 4.

A gate interconnection of a desired shape is then formed by photo-resist masking as shown in FIG. 4 by a dry etch such as RIE method. Thereafter, a nitride film 4 is deposited on the entire surface of the structure in FIG. 4. Nitride film 4 brings about a high etching selective ratio of the oxide film upon dry etch using RIE method, for example, and specifically, a silicon nitride film deposited by CVD method or the muti-layer film thereof is herein used. The silicon nitride film or the muti-layer film has a thickness ranging from 20 to 100 nm (FIG. 5).

Figure 6:
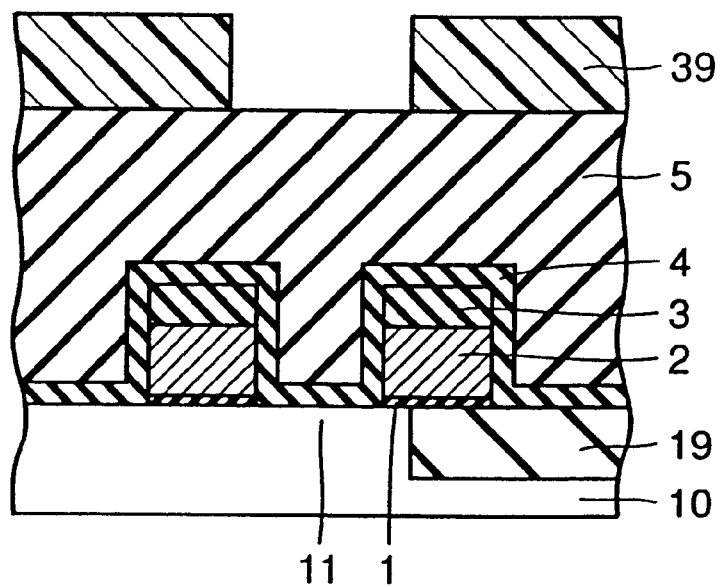
FIG. 6 is a sectional view of a structure in which an inter-layer oxide film is deposited on the structure of FIG. 5 and a mask having a predetermined shape is provided on a predetermined position.
Figure 7:
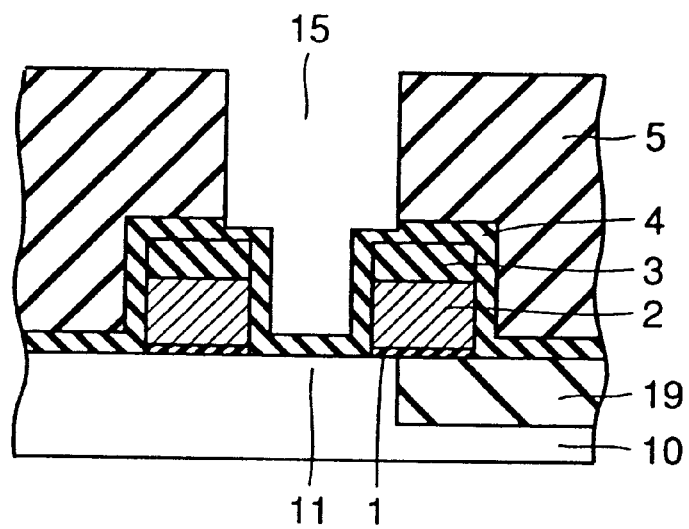
FIG. 7 is a sectional view of a structure in which an inter-layer oxide film is etched to remove the mask from the structure of FIG. 6.
Figure 8:
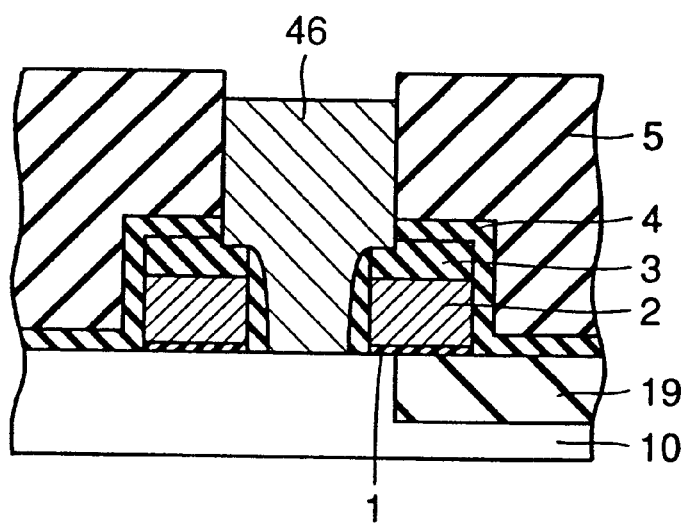
FIG. 8 is a sectional view of a structure subsequent to the structure of FIG. 7, in which the nitride film at the bottom of the contact hole is removed and a plug is deposited.

Next, silicon oxide film 5 is deposited as an inter-layer insulating film. Silicon oxide film 5 is an undoped silicon oxide film or a silicon oxide film doped with P, B or the like, using a reduced pressure and an atmospheric CVD methods. Thickness of such silicon oxide film ranges from 200 to 100 nm. A photo-resist mask 39 is then provided in order to open a contact hole at a desired location, as shown is FIG. 6. Thereafter, a contact hole 15 is opened into silicon oxide film 5, which is an inter-layer insulating film, as shown in FIG. 7, by dry etching such as RIE method. In this step, two types of pad contact holes, the first pad contact hole and the second pad contact hole, are simultaneously opened. Here, by etching having a large etching selective ratio of a silicon oxide film to a nitride film, the etching can be stopped in the middle of the nitride film without largely etching nitride films 3, 4, which are protective films for gate interconnection 2. Furthermore, the nitride film at the bottom of a contact hole 15 is removed by dry etching such as RIB method. At that time, there is a high possibility, in the first dummy pad contact hole, that the gate interconnection may be exposed or the gate interconnection coating may become extremely thin. As shown in FIG. 8, a plug 46 is formed by depositing a silicon film in the above-described contact hole by CVD method. A silicon film is deposited as plug 46 by CVD method, and a polycrystalline silicon film or an amorphous silicon film, doped with P, As, or the like and deposited by RIB method, for example, is used for the plug. A refractory metal silicide film such as Ti, TiN, or W, or the multi-layer film thereof, or a conducting metal film such as W, Al may also be used for plug 46. Any of the films has a thickness ranging from 100 to 400 nm.

Figure 9:
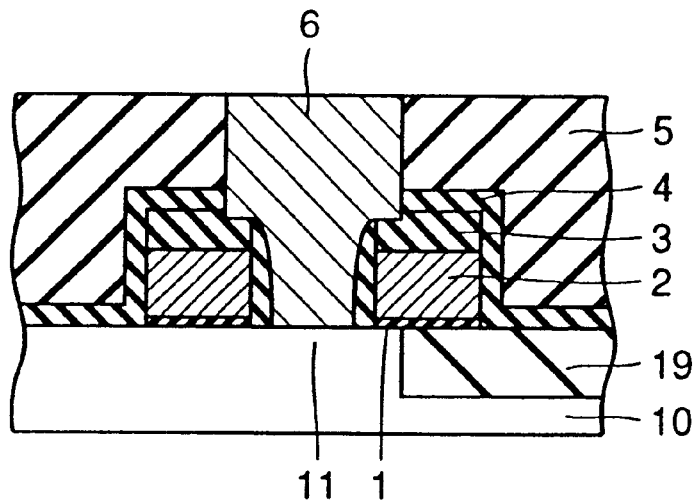
FIG. 9 is a sectional view of a structure in which the inter-layer insulating film is polished to planarize the structure of FIG. 8.
Figure 10:
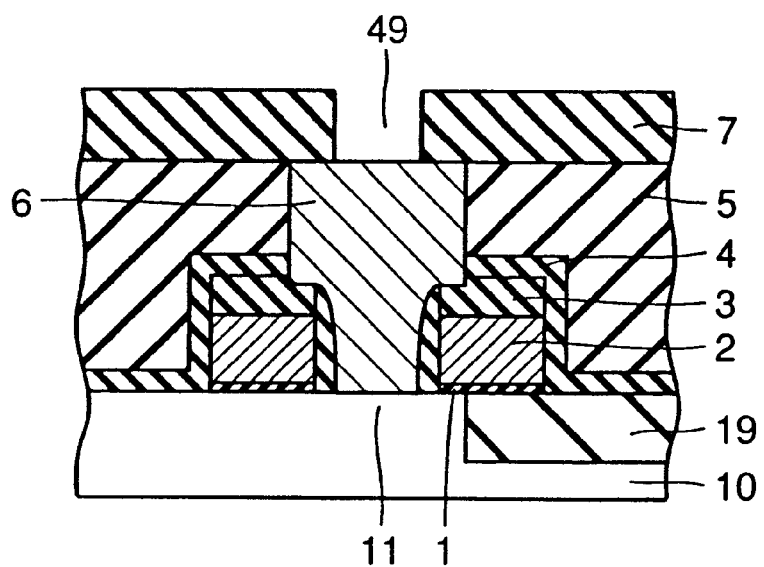
FIG. 10 is a sectional view of a structure in which an insulating film is formed on the structure of FIG. 9 and a bit line contact hole is opened.
Figure 11:
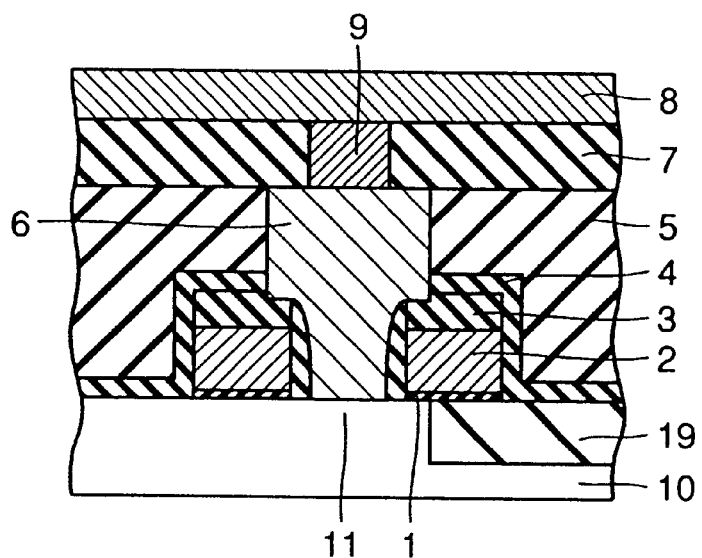
FIG. 11 is a sectional view of a structure in which a metal film is deposited on the structure of FIG. 10 to form a bit line contact and a bit line.

Thereafter, as shown in FIG. 9, a recess on the plug is eliminated by polishing such as CMP to form the second pad contact 6 as well as the first pad contact 20 and the first dummy pad contact 21 at the same time, and a stepped portion is planarized. Next, a silicon oxide film 7 is deposited as an inter-layer film and then a bit contact hole 49 is opened, as shown in FIG. 10. Silicon oxide film 7 is an undoped silicon oxide film or a silicon oxide film doped with P, B or the like, deposited using a reduced pressure and an atmospheric CVD methods. Any of these silicon oxide films has a thickness ranging from 100 to 1000 nm. A metal film is then deposited to form a bit line contact 9 into a bit line contact hole 49, and bit line 8 is shaped as intended by photo-resist masking, by dry etching such as RIE method (FIG. 11). A silicide of a refractory metal film such as Ti, TiN, or W, or the muti-layer film thereof is used for the metal film. A conducting metal film such as W, Al or the like may also be used for the film. In any case, the film has a thickness ranging from 100 to 400 nm.

Figure 12:
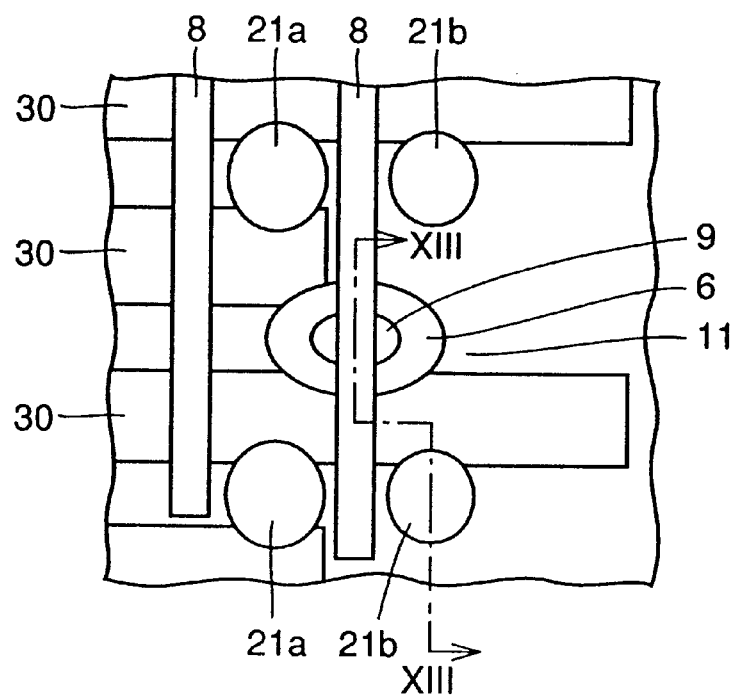
FIG. 12 is a top plan view illustrating an arrangement of the first dummy pad contacts arranged in two lines according to a semiconductor device of the first embodiment.
Figure 33:
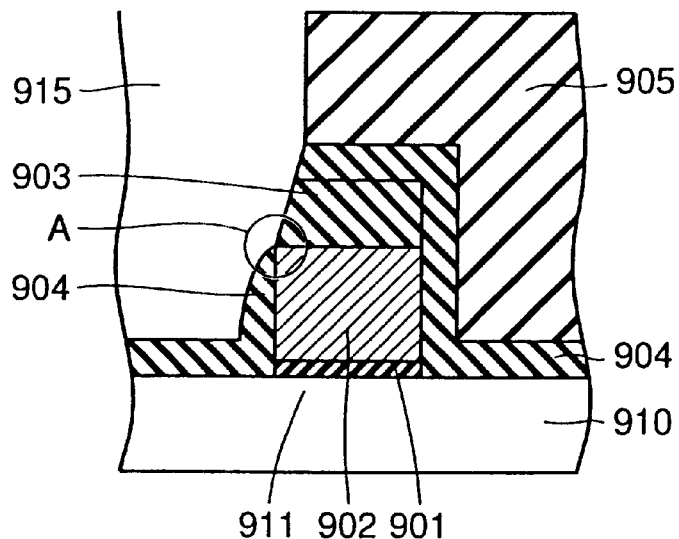
FIG. 33 is a sectional view illustrating a structure in which a gate interconnection coating is thinner at the opening of the first dummy pad contact hole shown in FIG. 32.
Figure 34:
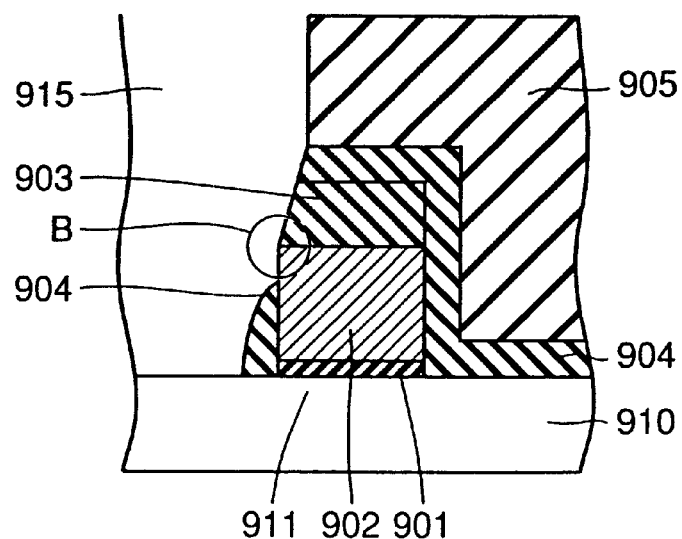
FIG. 34 is a sectional view illustrating a structure subsequent to the structure of FIG. 33, showing a gate interconnection exposed when the nitride film at the bottom of the first pad contact hole is further etched.
Figure 35:
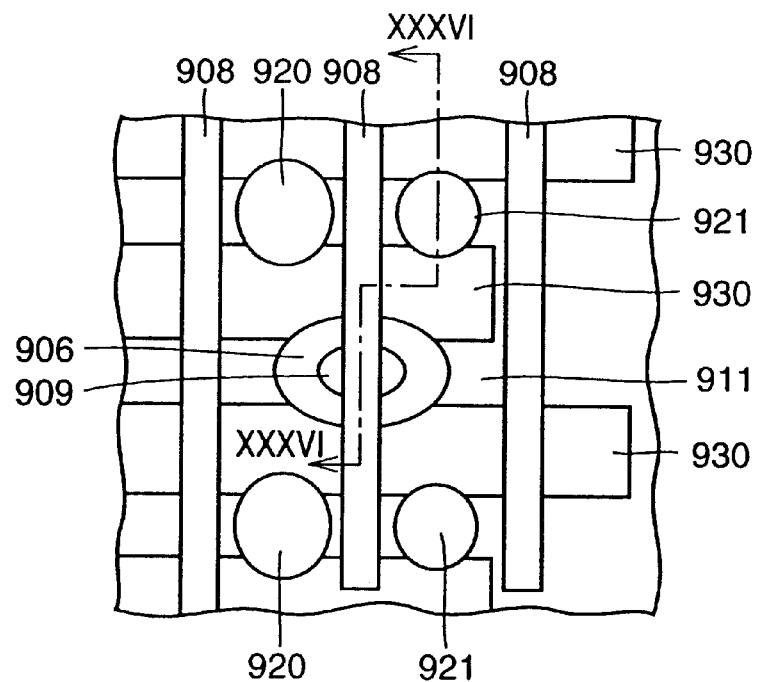
FIG. 35 is a top plan view of an end portion of a memory cell in the structure of FIG. 34.

An important point in the above-described manufacturing method is to locate the first dummy pad contact 21b in the end-most line, of the two lines of the first pad contacts 21a and 21b, on isolating region 19, not on active region 11. When opening the first pad contact hole, by the optical proximity effect, the size of dummy pad contact 21b in the end-most line becomes smaller as shown in FIG. 12, than that of the pad contacts located in the inner lines, including the first dummy pad contact 21a. This results in a reduction of the etching selective ratio of the oxide film (i.e., an inter-layer insulating film) to the nitride film, upon etching of the opening of first dummy pad contact 21b. The reason for this is as follows: $C_4F_8$, $C_5F_8$, $CH_2F_2$ or the like is used for etching gas species for the inter-layer oxide film, and the plasma gas etches the inter-layer oxide film and the nitride film while depositing a deposition film of polymer including C on the nitride film. Thus, if the contact area between a nitride film of a gate interconnection and etching gas is wide enough, the nitride film is etched while sufficient deposition film being deposited. When only a corner of the gate interconnection coating and the etching gas are contacted, however, the deposition does not much proceed while etching only proceeds. Thus, when the diameter of the contact hole formed by self-alignment method is small, the etching selective ratio of the oxide film to the nitride film in etching will be low. Therefore, the nitride film (i.e., a coating film of a gate interconnection) is largely etched, resulting in high possibility of short-circuiting between gate interconnection 2 and first dummy pad contact 21b, as shown in FIGS. 33 and 34.

Figure 13:
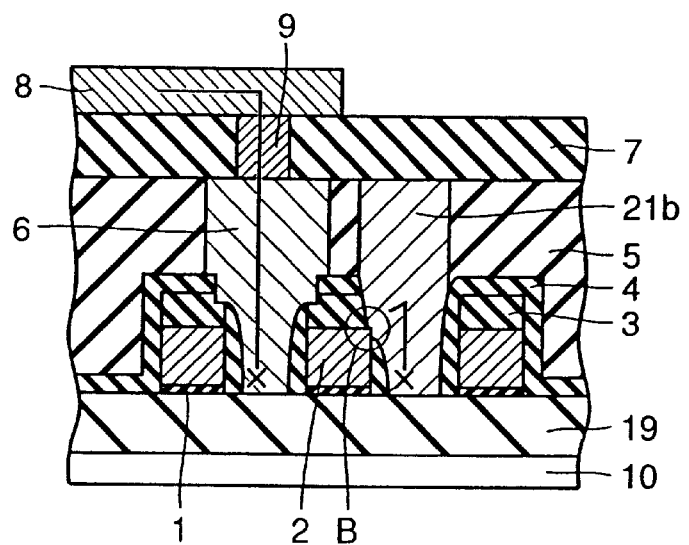
FIG. 13 is a sectional view taken along line XIII—XIII of FIG. 12.

In the embodiment, even if the gate interconnection and the first dummy pad contact are short-circuited, the potential of the gate interconnection will not be influenced by the bit line. That is, as shown in FIG. 13, even if first dummy pad contact 21b is short-circuited with gate interconnection 2 at section B, first dummy pad contact 21b is only in contact with isolating region 19 at a lower end portion, not with active region 11. As a result, gate interconnection 2 is conducted into bit line 8, preventing the potential gate interconnection 2 from affecting that of the bit line.

Second Embodiment

Figure 14:
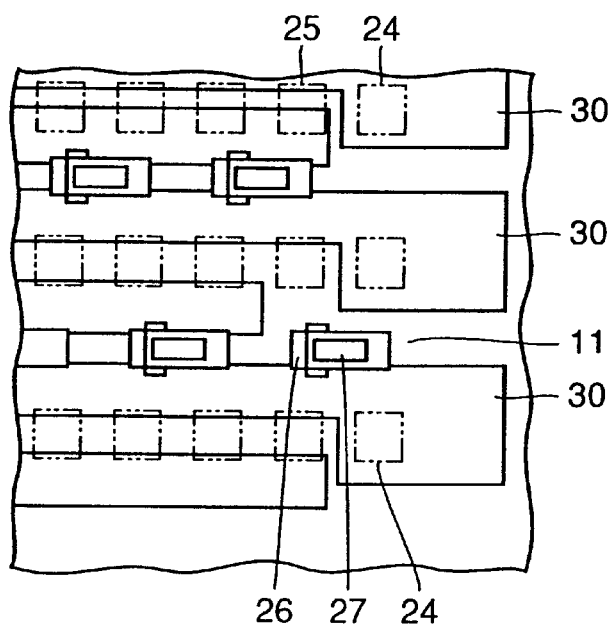
FIG. 14 is a top plan view illustrating an end portion of a memory cell in a semiconductor device of the second embodiment, with openings shown in imaginary lines.

In FIG. 14, a mask 24 for the first dummy pad contact is provided outer than a mask 25 for the first pad contact in the memory cell body. A mask 27 for the bit contact and a mask 26 for the second pad contact are provided between the masks for the first pad contacts. A bit line is not shown in FIG. 14.

Figure 15:
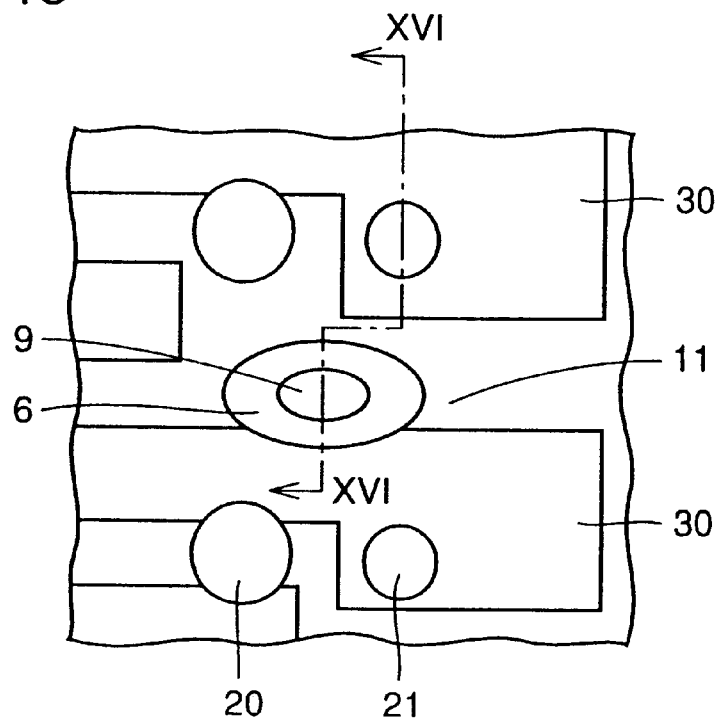
FIG. 15 is a top plan view illustrating a shape and an arrangement of a gate interconnection at an end portion of a memory cell according to a semiconductor device of the second embodiment.
Figure 16:
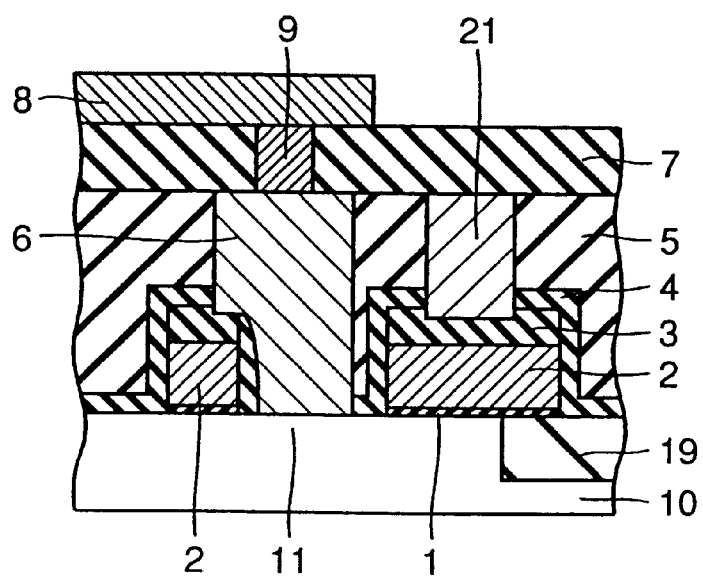
FIG. 16 is a sectional view taken along line XVI—XVI of FIG. 15.

A characteristic of the second embodiment is that the width of a gate interconnection 30 is made wider at an end portion of a memory cell so as to cover the entire first dummy pad contact 21. The manufacturing method of a semiconductor according to the second embodiment is the same as that of the first embodiment, except the difference in the width of a gate interconnection at an end portion of a memory cell. In the second embodiment, when opening a pad contact hole, the size of first dummy pad contact 21 also becomes smaller than that of first pad contact 20 in the memory cell body, as shown in FIG. 15. First dummy pad contact 21, however, is positioned completely on gate interconnection 2, so that the etching selective ratio of the oxide film to the nitride film upon etching can sufficiently be large.

This is because plasma gas such as $C_4F_8$, $C_5F_8$, $CH_2F_2$ or the like etches the inter-layer oxide film and the nitride film while depositing a deposition film of polymer including C on the nitride film, when the contact area between the nitride film of the gate interconnection coating and the etching gas is wide enough. As a result, even if the size of the dummy pattern is small, the gate interconnection and the first dummy pad contact will not be short-circuited. Therefore, the conduction between the gate interconnection and the bit line will not occur and the potential of the gate interconnection will not be influenced by that of the gate interconnection.

Third Embodiment

Figure 17:
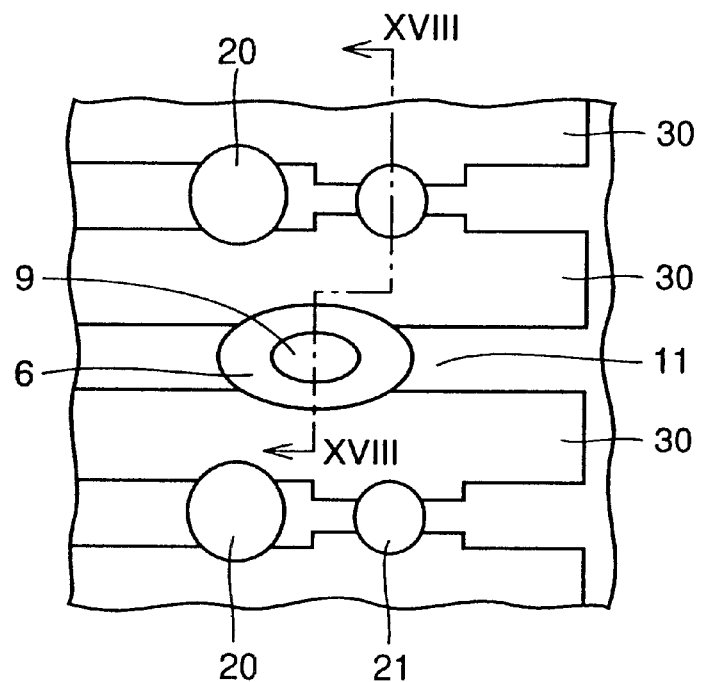
FIG. 17 is a top plan view illustrating a shape and an arrangement of a gate interconnection at an end portion of a memory cell according to a semiconductor device of the third embodiment.
Figure 18:
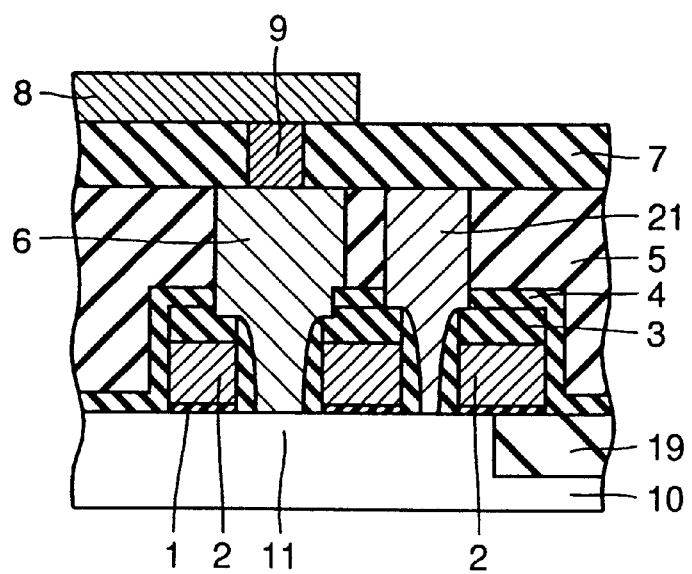
FIG. 18 is a sectional view taken along line XVIII—XVIII of FIG. 17.
Figure 36:
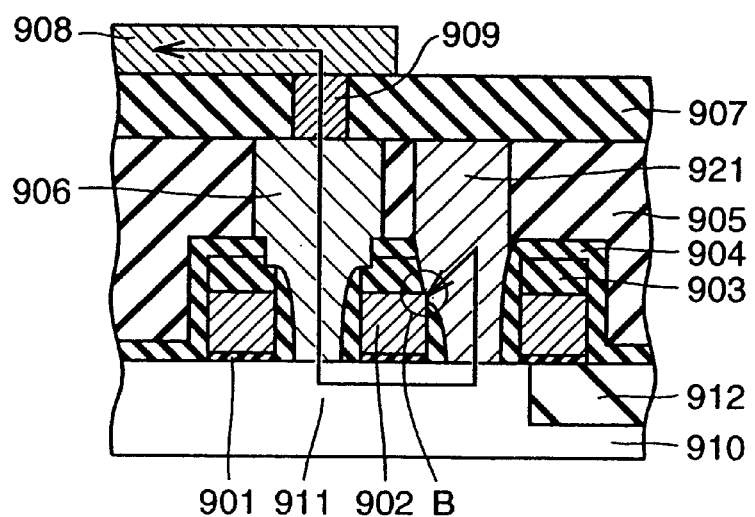
FIG. 36 is a sectional view taken along line XXXVI—XXXVI of FIG. 35.
Figure 37:
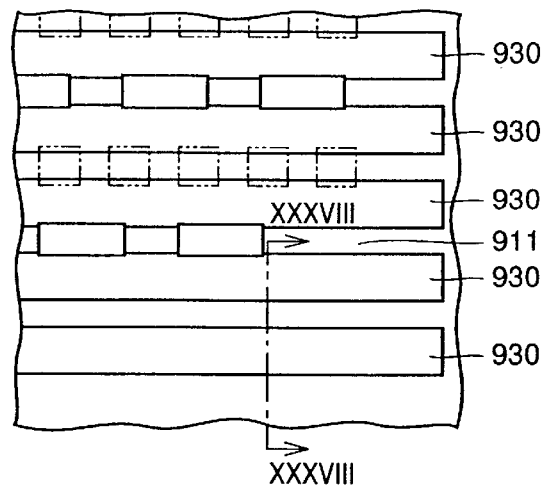
FIG. 37 is a top plan view illustrating arrangements of various portions in an end portion of a memory cell where a step is formed.
Figure 38:
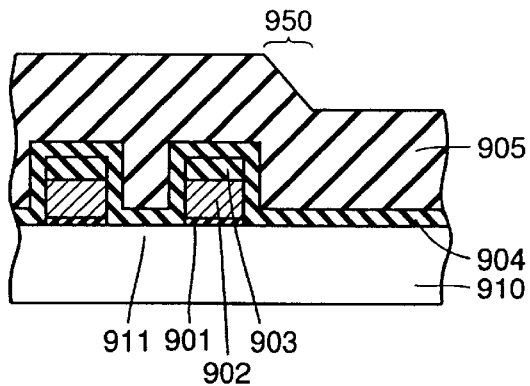
FIG. 38 is a sectional view taken along XXXVIII—XXXVIII of FIG. 37.
Figure 39:
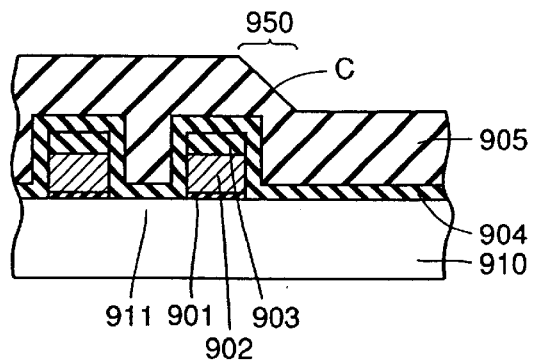
FIG. 39 is a sectional view illustrating a structure subsequent to the structure of FIG. 38, in which a step remains even after polishing.

In FIG. 17, gate interconnection 30 widens in the vicinity of first dummy pad contact 21. The size of first dummy pad contact 21 becomes smaller, when its contact hole is opened, than that of the first pad contact in the memory cell, due to the optical proximity effect. Employment of the structure of this embodiment, however, enables a sufficiently high etching selective ratio to be attained up on etching of the oxide film. In that case, the gate interconnections are extending over some portions of the first dummy pad contact, so that the sufficient contact area is maintained between etching gas and the nitride film. Thus, a high etching selective ratio of the oxide film to the nitride film can be maintained. Therefore, even if the first pad contact is small in size, no short-circuits will occur with the gate interconnection, as shown in FIG. 18. As a result, the event shown in the prior art embodiment of FIG. 36, in which a short-circuit occurs between the gate interconnection and the bit line, affecting the potential of the bit line to that of the gate interconnection, can simply be avoided.

Fourth Embodiment

Figure 19:
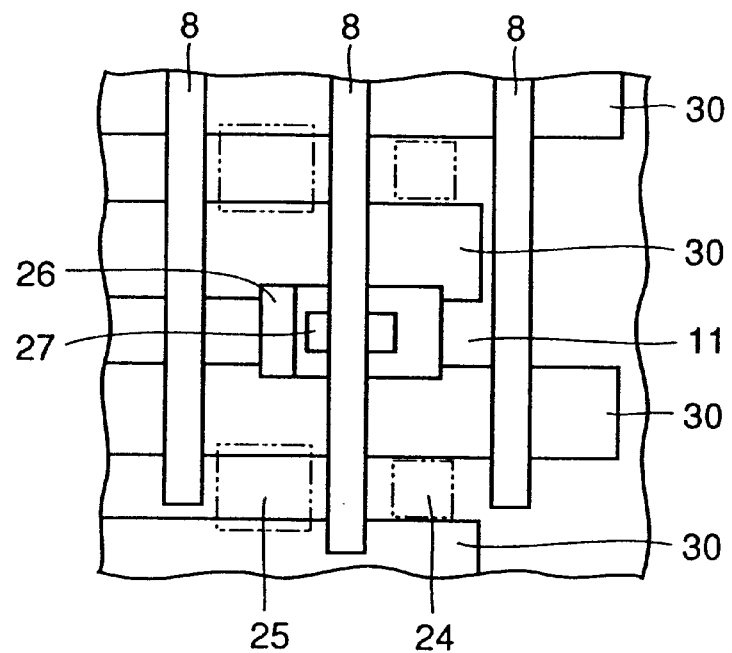
FIG. 19 is a top plan view illustrating an end portion of a memory cell according to a semiconductor device of the fourth embodiment, with mask openings of the first dummy pad contacts shown in imaginary lines.

In FIG. 19, mask opening 25 for the first pad contact in a memory cell body is provided inner from mask opening 24 for the first dummy pad contact, and mask openings 26 and 27 for the second pad contact and a bit line contact respectively are arranged in a dotted line between the lines of openings 24 and 25. In the fourth embodiment, the size of first pad contact 23 is made smaller, at the formation of opening 24 of a mask pattern, than that of mask opening 25 for first pad contact 20 in the memory cell body.

Figure 20:
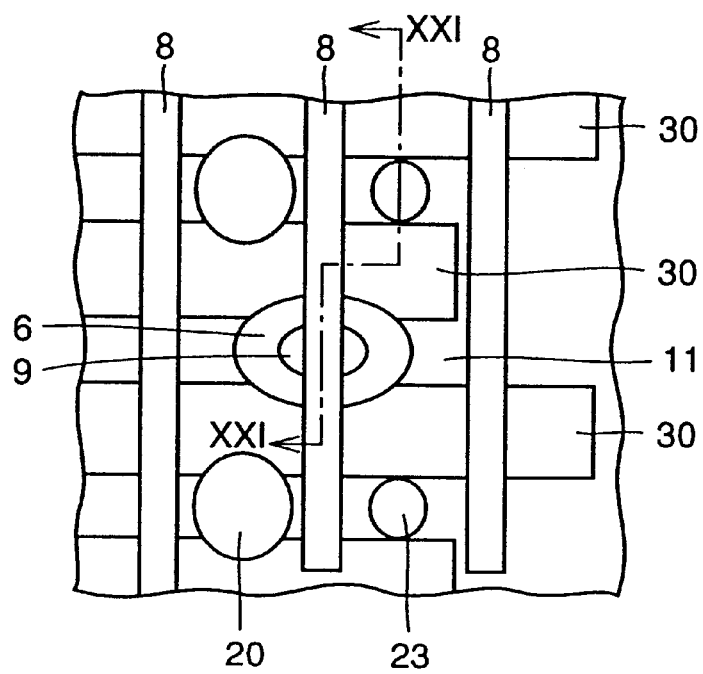
FIG. 20 is a top plan view illustrating the first dummy pad contacts formed by the mask openings of FIG. 19.
Figure 21:
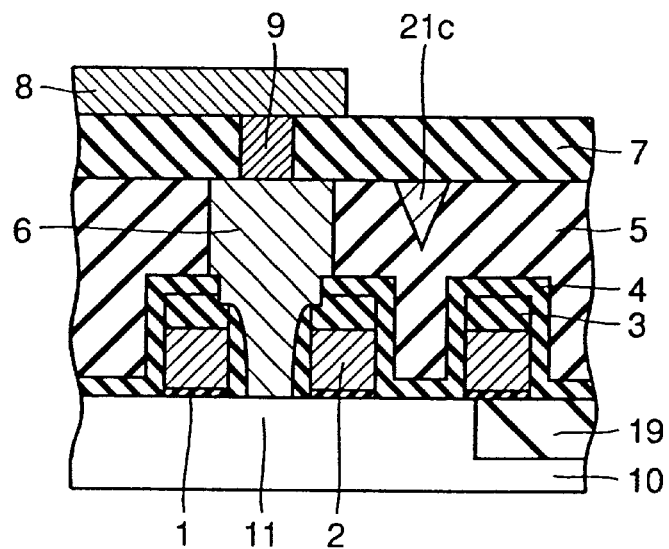
FIG. 21 is a sectional view taken along line XXI—XXI of FIG. 20.
Figure 22:
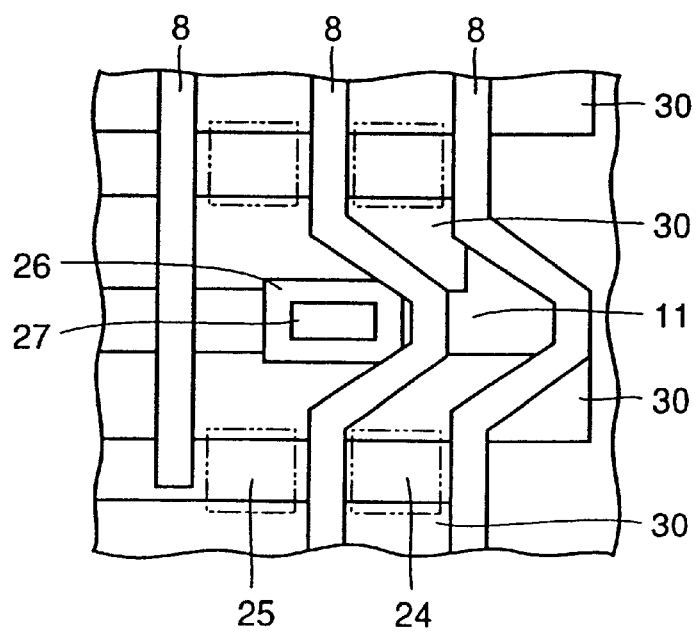
FIG. 22 is a top plan view illustrating a bit line formed detouring the bit contacts to avoid contacting therewith according to a semiconductor device of the fifth embodiment.

In addition to the fact that the mask diameter formed small upon opening by etching the oxide film, the size of the first dummy pad contact is further reduced by the optical proximity effect. Thus, as shown in FIG. 20, the first dummy pad contact is either very small or not opened by the time of the photo-resist. If pad contact is formed very small, deposits are deposited at the bottom of the hole during opening, when etched under the condition of sufficiently high etching selective ratio of the oxide film to the nitride film by the self-alignment method, and the etch may stop unfinished. As a result, as shown in FIG. 21, the intentional reduction in the diameter of the first dummy pad contact to cause a poor opening can prevent the conduction between the gate interconnection and the bit line.

Fifth Embodiment

In a semiconductor device according to the fifth embodiment, bit line 8 at an end portion of the memory cell is arranged detouring mask opening 27 of the bit line contact so as to avoid the contact therewith. By employing such a structure, the conduction between the gate interconnection and the bit line will be prevented even if the first dummy pad contact is short-circuited with the gate interconnection.

Sixth Embodiment

Figure 23:
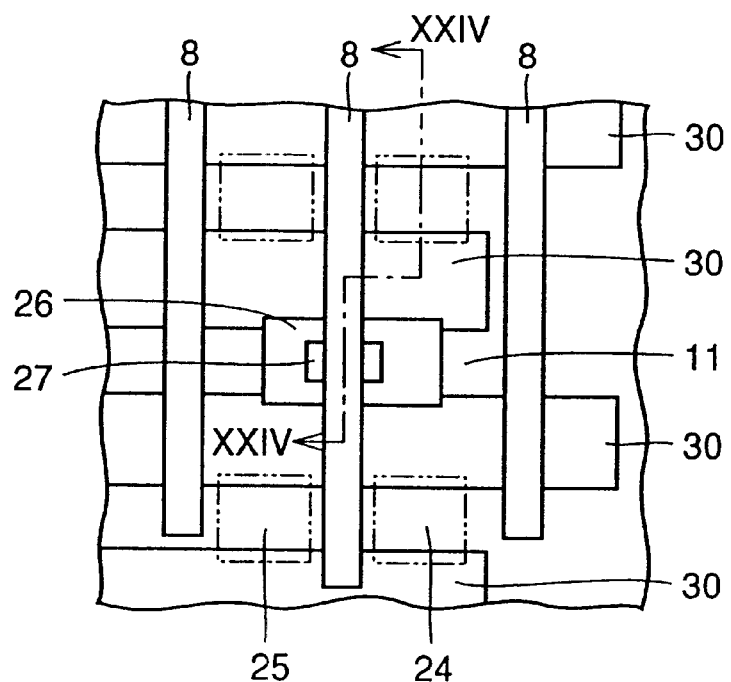
FIG. 23 is a top plan view of an end portion of a memory cell according to a semiconductor device of the sixth embodiment, with mask openings of bit line contacts shown in imaginary lines.
Figure 24:
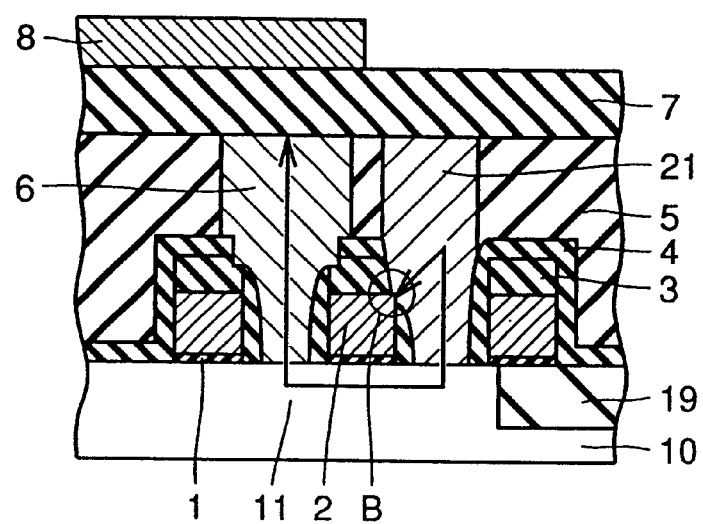
FIG. 24 is a sectional view taken along line XXIV—XXIV of FIG. 23.

In a semiconductor device according to the sixth embodiment, as shown in FIG. 23, the bit line contact is formed smaller when forming mask opening 27 so as to remain unopened at the time of photo-resist masking. This results in the prevention of the electrical conduction between the second pad contact and the bit line contact, since the bit line contact is not opened after etching, as shown in FIG. 24. Thus, even if the dummy pad contact is short-circuited with the gate interconnection, no short-circuit will occur between the gate interconnection and the bit line, as shown in FIG. 24, so that the potential of the gate interconnection is not influenced.

Seventh Embodiment

Figure 25:
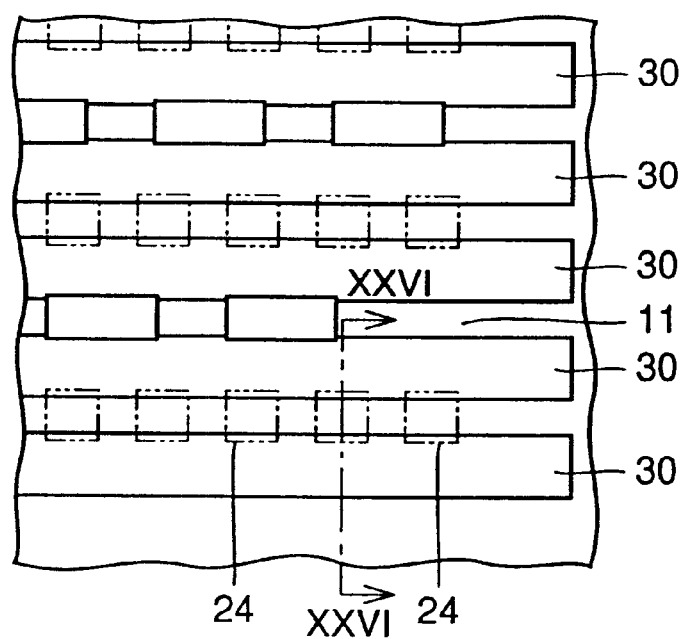
FIG. 25 is a top plan view illustrating the first dummy pad contacts arranged in an end portion of a memory cell where a step is formed, according to a semiconductor manufacturing method of the seventh embodiment.
Figure 26:
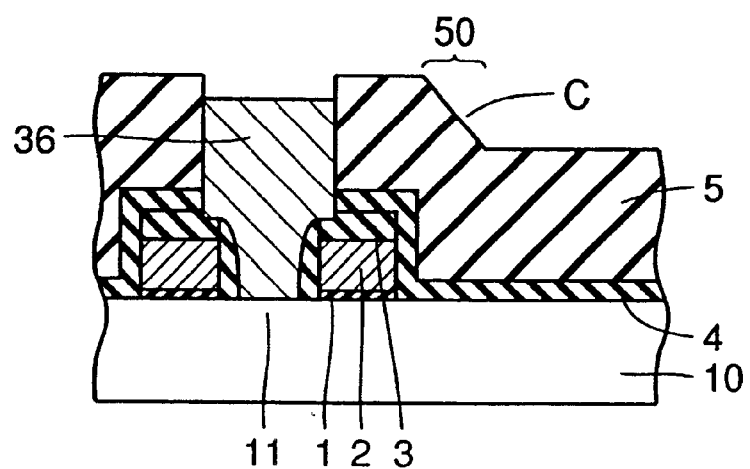
FIG. 26 is a sectional view taken along line XXVI—XXVI.
Figure 27:
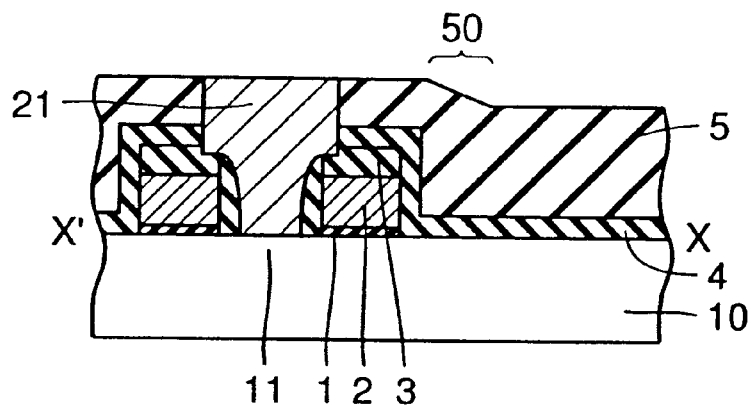
FIG. 27 is a sectional view illustrating a structure subsequent to the structure of FIG. 26, in which a surface is polished and planarized.
Figure 28:
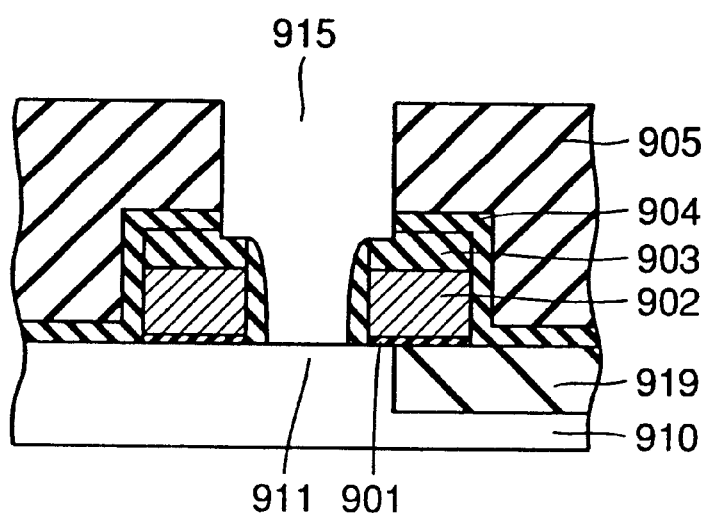
FIG. 28 is a sectional view of a structure, in which the first pad contact hole is opened at an end portion of a conventional memory cell.
Figure 29:
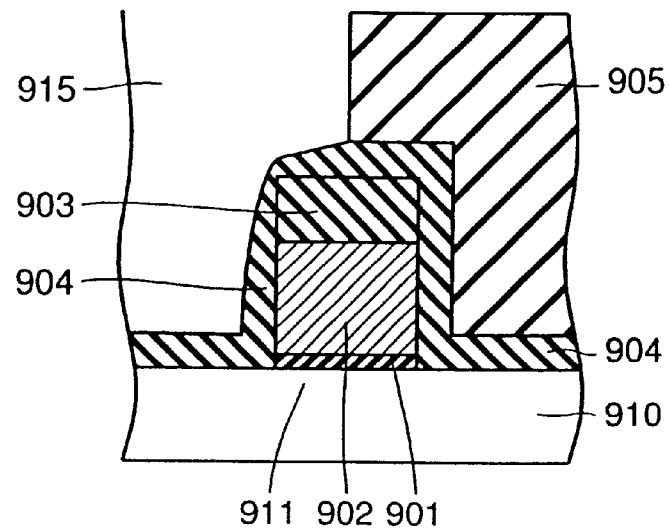
FIG. 29 is a sectional view illustrating a gate interconnection coating at the top corner of the gate interconnection of FIG. 28.
Figure 30:
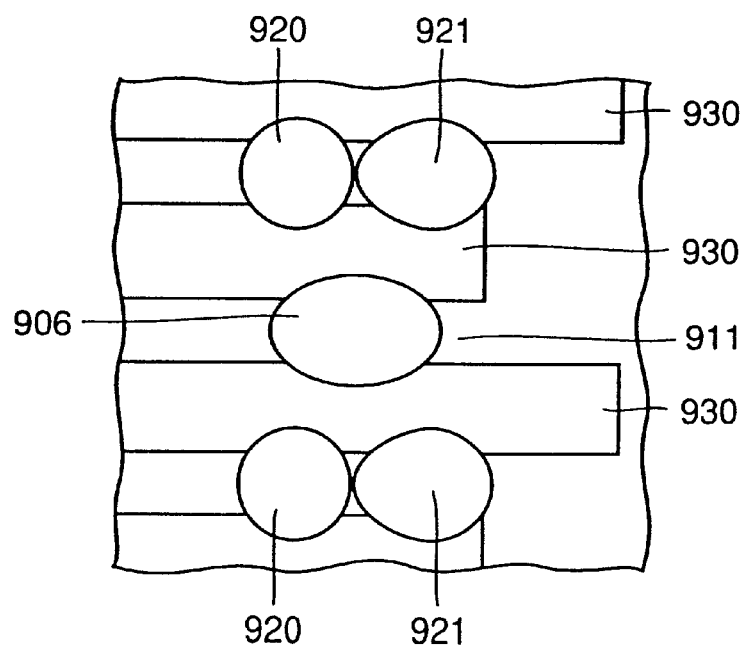
FIG. 30 is a top plan view illustrating dummy pad contacts formed with the enlarged mask diameter of the first dummy pad contacts.
Figure 31:
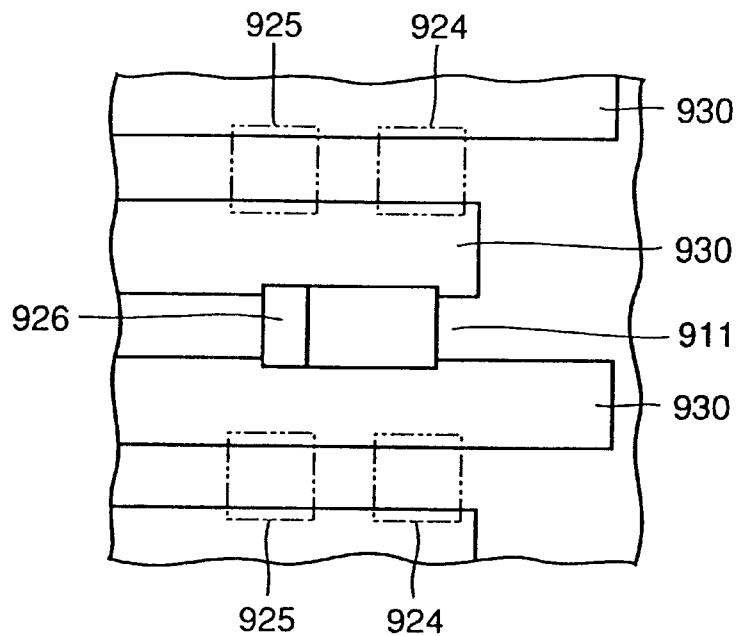
FIG. 31 is a top plan view of an end portion of a memory cell, in which a diameter of mask openings in the first dummy pad contacts has the same size as the diameter of the mask openings in pad contacts of a memory cell body.
Figure 32:
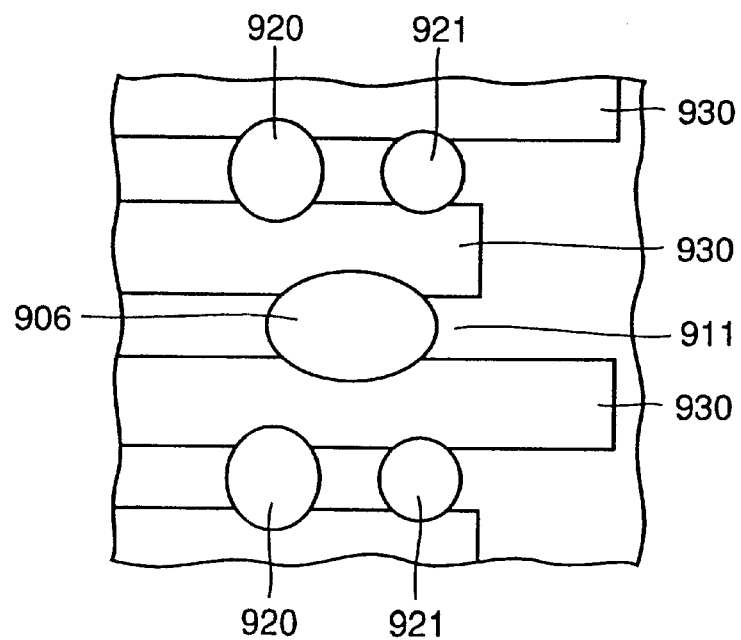
FIG. 32 is a top plan view illustrating the first dummy pad contact and the first pad contact formed at an end portion of a memory cell using the mask shown in FIG. 31.

In FIG. 25, there is shown an array of mask openings 24 arranged to form dummy pad contacts at an end of the memory cell where a step is formed. After forming a plug 36 of the pad contact, the location, where step C of gate interconnection or the like remains in a memory cell end 50, is planarized and polished using CMP and so forth, as shown in FIG. 26. An arrangement in which dummy pad contacts 21 are arranged at an end portion of the memory cell allows the polishing rate of CMP being high, when the area of the oxide film which contacts with a polishing cloth is reduced at the memory end. As a result, as shown in FIG. 27, the height of the step can simply be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a memory cell including an array of gate interconnections on a main surface of a semiconductor substrate;

forming an inter-layer insulating film over regions of said memory cell and a continuing peripheral region of said regions;

providing dummy pad contact holes, each at a gap between said gate interconnection and a bit line, in a dotted line along an end portion of said memory cell;

forming a plug in each of said dummy pad contact holes;

providing means for interrupting an electric conduction between one of said plugs in said dummy pad contact holes and said bit line in a path leading from said plug through an active region in said substrate, a pad contact and a bit line contact to said bit line; and polishing to planarize said inter-layer insulating film at the region of the memory cell including said dummy pad contact holes and the continuing peripheral region.

2. A method of manufacturing a semiconductor device according to claim 1, wherein said polishing of said inter-layer insulating film is performed by a chemical-mechanical polishing method.

3. A method of manufacturing a semiconductor device according to claim 1, wherein said means for interrupting said electric conduction is an isolating region formed between said semiconductor substrate and said plug.

* * * * *